(12) United States Patent
Oboukhov et al.

(10) Patent No.: US 11,979,163 B2
(45) Date of Patent: May 7, 2024

(54) OVERSAMPLED PHASE LOCK LOOP IN A READ CHANNEL

(71) Applicant: Western Digital Technologies, Inc., San Jose, CA (US)

(72) Inventors: Iouri Oboukhov, Rochester, MN (US); Derrick E. Burton, Ladera Ranch, CA (US); Richard Galbraith, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/958,877

(22) Filed: Oct. 3, 2022

(65) Prior Publication Data

US 2024/0120925 A1 Apr. 11, 2024

(51) Int. Cl.
*H03L 7/08* (2006.01)
*H03L 7/091* (2006.01)
*H03L 7/099* (2006.01)

(52) U.S. Cl.
CPC ............ *H03L 7/0807* (2013.01); *H03L 7/091* (2013.01); *H03L 7/0998* (2013.01)

(58) Field of Classification Search
CPC ..... H03L 7/0807; H03L 7/091; H03L 7/0998; H03L 7/08; H03L 7/10; H03L 7/085; H03L 7/087; H03L 7/099; H03L 7/0995
See application file for complete search history.

(56) References Cited

U.S. PATENT DOCUMENTS

| | | | | |
|---|---|---|---|---|
| 5,311,376 A * | 5/1994 | Joan | ............... | H04L 7/0337 |
| 5,802,118 A * | 9/1998 | Bliss | ............... | G11B 20/10009 |
| | | | | 375/350 |
| 5,937,020 A * | 8/1999 | Hase | ............... | H03L 7/087 |
| 6,072,368 A * | 6/2000 | Galbraith | ......... | H03L 7/14 |
| | | | | 375/376 |
| 6,208,477 B1 * | 3/2001 | Cloke | ............ | G11B 20/22 |
| | | | | 360/25 |
| 6,313,962 B1 * | 11/2001 | Galbraith | ......... | H03L 7/099 |
| 6,316,966 B1 * | 11/2001 | Chang | ............. | H03L 7/089 |
| | | | | 327/12 |

(Continued)

OTHER PUBLICATIONS

Garani et al., "Signal Processing and Coding Techniques for 2-D Magnetic Recording: An Overview," in Proceedings of the IEEE, vol. 106, No. 2, Feb. 2018, doi: 10.1109/JPROC.2018.2795961, pp. 286-318.

(Continued)

*Primary Examiner* — James M Perez
(74) *Attorney, Agent, or Firm* — Patent Law Works LLP

(57) ABSTRACT

Example systems, read channels, and methods provide an oversampled digital phase lock loop for use in a read channel. The phase lock loop receives a digital data signal comprised of oversampled digital signal values with a sample rate that is a multiple of the baud rate of the channel. A set of oversampled digital signal values is selected for each iteration of the phase lock loop to correct the phase of an analog-to-digital converter. The phase lock loop determines a phase gradient, based on an iterative detector, and feeds back a phase correction for the next iteration of the phase lock loop. A baud rate digital data signal is provided to the rest of the channel based on down sampling or interpolated based on the phase gradient.

19 Claims, 8 Drawing Sheets

(56) References Cited

U.S. PATENT DOCUMENTS

| | | | | |
|---|---|---|---|---|
| 6,347,128 | B1* | 2/2002 | Ransijn | H04L 7/033 713/400 |
| 6,526,109 | B1* | 2/2003 | Chang | H03L 7/089 327/158 |
| 6,785,074 | B2* | 8/2004 | Tsuchinaga | G11B 5/012 360/31 |
| 6,856,183 | B2* | 2/2005 | Annampedu | G11B 20/1403 |
| 7,068,459 | B1* | 6/2006 | Cloke | G11B 5/59661 360/75 |
| 7,092,466 | B2* | 8/2006 | Hwang | H03L 7/0995 375/355 |
| 7,142,379 | B2* | 11/2006 | Tsuchinaga | G11B 5/09 360/39 |
| 7,315,598 | B2* | 1/2008 | Lee | H03L 7/091 375/355 |
| 7,333,280 | B1* | 2/2008 | Lifchits | G11B 5/596 360/75 |
| 7,440,210 | B1* | 10/2008 | Lee | G11B 5/59661 360/48 |
| 7,548,123 | B2* | 6/2009 | Frey | H03L 7/113 331/25 |
| 7,675,703 | B2* | 3/2010 | Albrecht | G11B 20/10009 360/51 |
| 7,733,591 | B2* | 6/2010 | Bottemiller | G11B 20/10055 |
| 7,733,592 | B2* | 6/2010 | Hutchins | H04L 7/0029 375/327 |
| 7,777,980 | B2* | 8/2010 | Hutchins | G11B 20/10037 375/376 |
| 7,974,369 | B2* | 7/2011 | Liu | G11B 20/10055 375/373 |
| 8,054,931 | B2* | 11/2011 | Annampedu | H04L 7/0054 375/376 |
| 8,466,713 | B2* | 6/2013 | Stojanovic | H04L 7/033 327/2 |
| 8,837,656 | B2* | 9/2014 | Stojanovic | H03L 7/091 375/355 |
| 8,964,321 | B2* | 2/2015 | Cideciyan | G11B 27/30 360/39 |
| 9,214,187 | B2* | 12/2015 | Cideciyan | G11B 20/1833 |
| 10,142,089 | B2* | 11/2018 | Yao | H03L 7/0807 |
| 10,447,315 | B2* | 10/2019 | Venkataramani | H03M 13/6337 |
| 10,790,838 | B1* | 9/2020 | Mosalikanti | H03L 7/085 |
| 10,833,681 | B1* | 11/2020 | Kumar | H03L 7/091 |
| 10,991,390 | B2* | 4/2021 | Kobayashi | G11B 33/14 |
| 11,184,008 | B2* | 11/2021 | Kumar | H03L 7/0807 |
| 11,688,420 | B2* | 6/2023 | Malina | G11B 21/006 360/110 |
| 11,798,587 | B1* | 10/2023 | Guo | G11B 5/5573 |
| 2002/0085656 | A1* | 7/2002 | Lee | H04L 7/0337 375/373 |
| 2003/0011920 | A1* | 1/2003 | Tsuchinaga | G11B 20/22 |
| 2003/0072099 | A1* | 4/2003 | Annampedu | G11B 20/18 |
| 2003/0107442 | A1* | 6/2003 | Staszewski | H03L 7/0991 331/1 A |
| 2003/0115542 | A1* | 6/2003 | Hwang | H03L 7/0995 714/798 |
| 2003/0133522 | A1* | 7/2003 | Staszewski | H01L 7/085 375/345 |
| 2003/0141936 | A1* | 7/2003 | Staszewski | H03L 7/085 331/16 |
| 2005/0018337 | A1* | 1/2005 | Tsuchinaga | G11B 5/012 360/39 |
| 2007/0002990 | A1* | 1/2007 | Lee | H03L 7/0814 375/355 |
| 2007/0061687 | A1* | 3/2007 | Hwang | H03M 13/6343 714/780 |
| 2008/0144454 | A1* | 6/2008 | Bottemiller | G11B 20/10222 |
| 2008/0304173 | A1* | 12/2008 | Albrecht | G11B 5/746 360/51 |
| 2009/0015338 | A1* | 1/2009 | Frey | H03L 7/1976 327/156 |
| 2009/0052602 | A1* | 2/2009 | Annampedu | H03L 7/093 375/376 |
| 2011/0103527 | A1* | 5/2011 | Liu | H03L 7/07 375/355 |
| 2012/0008723 | A1* | 1/2012 | Stojanovic | H03L 7/091 375/355 |
| 2012/0068748 | A1* | 3/2012 | Stojanovic | H03L 7/091 327/161 |
| 2014/0355147 | A1* | 12/2014 | Cideciyan | G11B 20/10009 360/31 |
| 2018/0278405 | A1* | 9/2018 | Yao | H04L 7/0334 |
| 2021/0143824 | A1* | 5/2021 | Kumar | H04L 25/03057 |
| 2022/0149930 | A1* | 5/2022 | Rolle | H04L 5/0044 |
| 2023/0119518 | A1* | 4/2023 | Lee | H03L 7/085 327/158 |
| 2023/0141431 | A1* | 5/2023 | Malina | G11B 5/584 360/110 |
| 2023/0388171 | A1* | 11/2023 | Bogdan | H04L 27/2657 |

OTHER PUBLICATIONS

Olcer et al., "Compensation of PLL Loop Delay in Read Channels for Tape Storage Systems," in GLOBECOM 2009—2009 IEEE Global Telecommunications Conference, Nov. 30-Dec. 4, 2009, Honolulu, HI, available online at https://ieeexplore.ieee.org/document/5425364, 5 pgs.

* cited by examiner

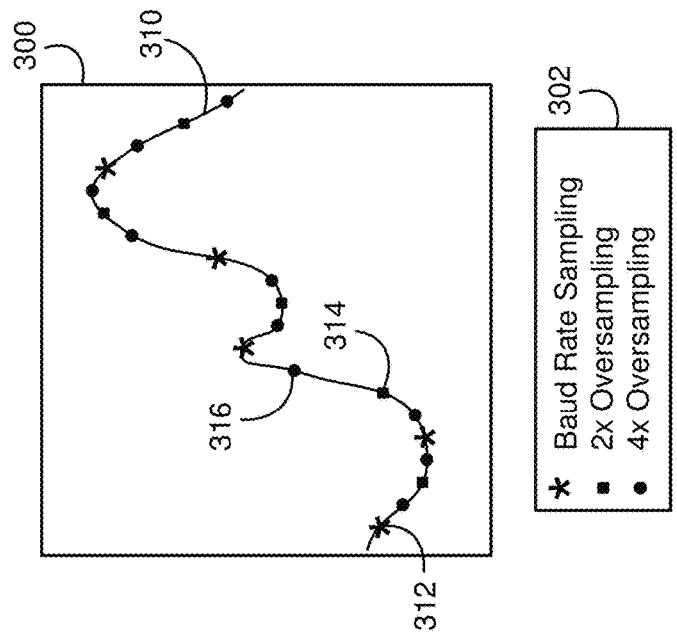
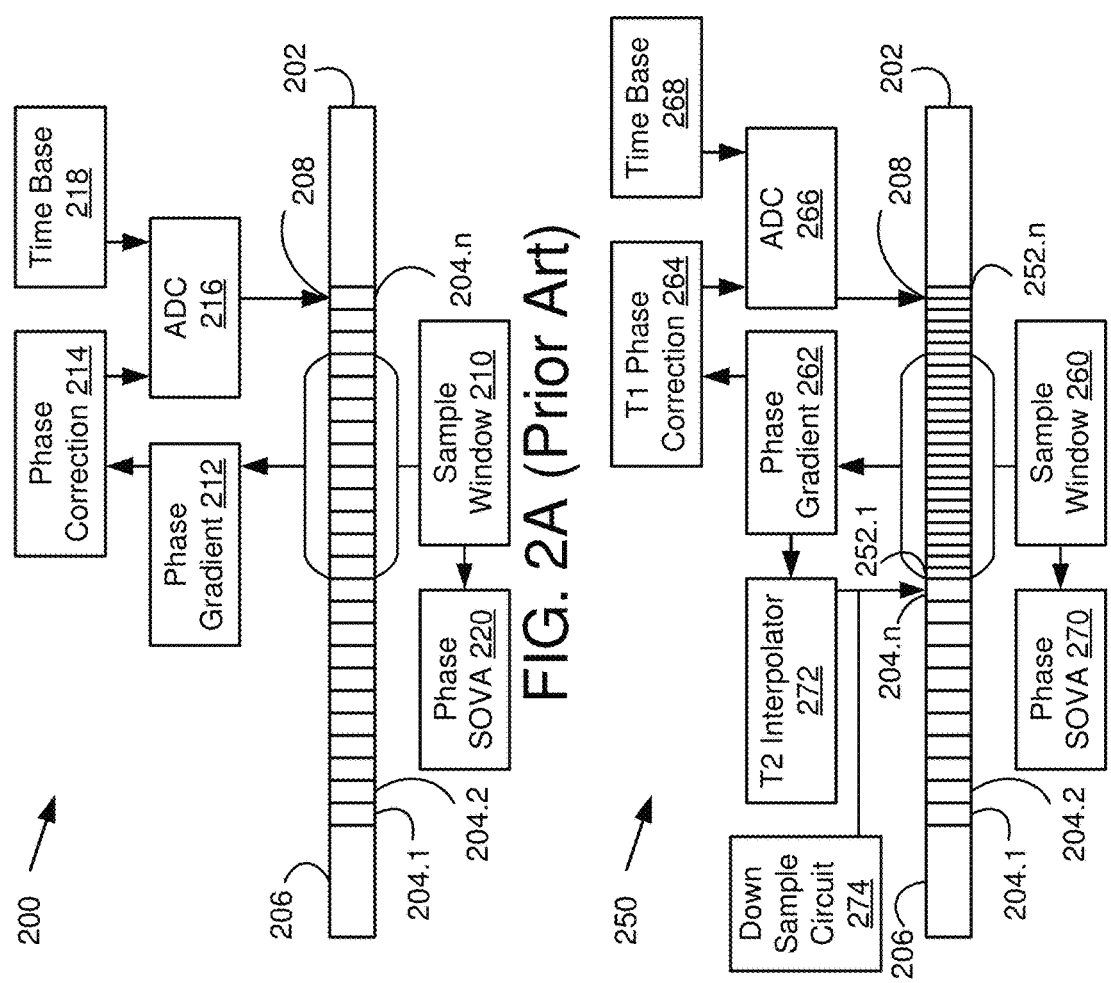

OVERSAMPLED PHASE LOCK LOOP IN A READ CHANNEL

TECHNICAL FIELD

The present disclosure relates to data detection. In particular, the present disclosure relates to improved read channel data detection using an oversampled phase lock loop.

BACKGROUND

Conventional tape drive storage systems comprise a magnetic tape wound around a dual reel (reel-to-reel cartridge) or a single reel (endless tape cartridge), wherein the reel(s) are rotated in order to move the magnetic tape over one or more transducer heads during write/read operations. The format of the magnetic tape may be single track or multiple tracks that are defined linearly, diagonally, or arcuate with respect to the longitudinal dimension along the length of the tape. With a linear track format, the heads may remain stationary relative to the longitudinal dimension of the tape, but may be actuated in a lateral dimension across the width of the tape as the tape moves past the heads. With a diagonal or arcuate track format, the heads may be mounted on a rotating drum such that during access operations both the heads and tape are moved relative to one another (typically in opposite directions along the longitudinal dimension of the tape).

Tape drives may rely on a phase lock loop (PLL) for maintaining phase alignment during read operations. Variations of tape speed may be significant. For example, tape speed variation may come from standing longitudinal waves in the tape induced by tape friction and a stick-slip process on the rollers. While some improvements speed variation may be made through mechanical, material, and/or speed control design, there may still be speed variations sufficient to disrupt the phase alignment of read signals.

There is a need for read channel technology for tape drive storage systems with an improved PLL. More specifically, a read channel that maintains phase alignment in spite of high variation in tape velocity may be advantageous.

SUMMARY

Various aspects for a phase lock loop (PLL) in the read channel of a tape data storage device using an oversampled digital signal in the feedback loop to the soft output Viterbi algorithm (S OVA) detector of the PLL are described.

One general aspect includes a channel circuit including a phase lock loop configured to: receive a digital data signal representing a series of data bits at a baud rate from an analog read signal, where the digital data signal includes oversampled digital signal values at a sample rate that is a multiple of the baud rate; determine a bit data pattern from the oversampled digital signal values of the digital data signal; determine, based on the bit data pattern and a bit response signal, an ideal signal; determine, based on a comparison of the bit data pattern and the ideal signal, a phase gradient; and feedback, based on the phase gradient, a phase correction for a next iteration of the phase lock loop.

Implementations may include one or more of the following features. The channel circuit may include an analog-to-digital converter configured to: generate, based on the sample rate, the oversampled digital signal values from the analog read signal; receive, from the phase lock loop, the phase correction; and correct a phase of a next set of oversampled digital signal values. The channel circuit may include a down sample circuit configured to: receive the oversampled digital signal values; down sample the oversampled digital signal values to a baud rate digital signal; and send the baud rate digital signal for data processing. The channel circuit may include a signal interpolator configured to: interpolate a set of oversampled digital signal values to approximate digital signal values between oversampled digital signal values in the set of oversampled digital signal values; and determine a corresponding set of baud rate digital signal values based on the phase gradient corresponding to the ideal signal. The phase lock loop may be further configured to use a first time constant for feedback of the phase correction for the next iteration of the phase lock loop; the signal interpolator may be further configured to use a second time constant for determining the corresponding set of baud rate digital signal values; and the first time constant may be larger than the second time constant. The phase lock loop may include an iterative detector configured to: determine the bit data pattern from the oversampled digital signal values; determine the bit response signal from the oversampled digital signal values; and determine, based on the bit data pattern and a bit response signal, the ideal signal. The phase lock loop further may include a gradient engine configured to: compare the bit data pattern and the ideal signal; and determine, based on the comparison of the bit data pattern and the ideal signal, the phase gradient. The sample rate may be at least double the baud rate of the channel circuit. A data storage device may include the channel circuit and further include: a non-volatile storage medium configured to store data; and at least one read element configured to generate the analog read signal from the non-volatile storage medium. The non-volatile storage medium may include magnetic tape comprised of a plurality of data tracks; the at least one read element may include a plurality of read elements corresponding to the plurality of data tracks; and the phase lock loop may be further configured to correct phase across the plurality of data tracks based on oversampled digital signal values from a plurality of analog read signals corresponding to the plurality of data tracks.

Another general aspect includes a method that includes: receiving, in a phase lock loop, a digital data signal representing a series of data bits at a baud rate from an analog read signal, where the digital data signal includes oversampled digital signal values at a sample rate that is a multiple of the baud rate; determining a bit data pattern from the oversampled digital signal values of the digital data signal; determining, based on the bit data pattern and a bit response signal, an ideal signal; determining, based on a comparison of the bit data pattern and the ideal signal, a phase gradient; and feeding back, based on the phase gradient, a phase correction for a next iteration of the phase lock loop.

Implementations may include one or more of the following features. The method may include: generating, by an analog-to-digital converter and based on the sample rate, the oversampled digital signal values from the analog read signal; receiving, by the analog-to-digital converter and from the phase lock loop, the phase correction; and correcting a phase of a next set of oversampled digital signal values. The method may include: down sampling the oversampled digital signal values to a baud rate digital signal; and sending the baud rate digital signal for data processing. The method may include: interpolating a set of oversampled digital signal values to approximate digital signal values between oversampled digital signal values in the set of oversampled digital signal values; and determining a corresponding set of baud rate digital signal values based on the phase gradient corresponding to the ideal signal. The phase lock loop may use a first time constant for feedback of the phase correction for the next iteration of the phase lock loop; a signal interpolator may use a second time constant for determining the corresponding set of baud rate digital signal values; and the first time constant may be larger than the second time constant. The method may include: determining the bit response signal from the oversampled digital signal values; and comparing the bit data pattern and the ideal signal. The sample rate may be at least double the baud rate. The method may include: reading a plurality of analog read signals from a plurality of data tracks on a magnetic tape; generating a plurality of digital data signals may include a plurality of oversampled digital signal values from the plurality of analog read signals; and correcting phase across the plurality of data tracks based on the plurality of oversampled digital signal values.

Still another general aspect includes a system that includes: means for receiving a digital data signal representing a series of data bits at a baud rate from an analog read signal, where the digital data signal includes oversampled digital signal values at a sample rate that is a multiple of the baud rate; means for determining a bit data pattern from the oversampled digital signal values of the digital data signal; means for determining, based on the bit data pattern and a bit response signal, an ideal signal; means for determining, based on a comparison of the bit data pattern and the ideal signal, a phase gradient; and means for feeding back, based on the phase gradient, a phase correction for a next iteration of the phase lock loop.

The present disclosure describes various aspects of innovative technology capable of improving read channel data detection using a digital PLL based on an oversampled digital signal for improved phase alignment despite variations in tape velocity. The digital PLL provided by the technology may be applicable to a variety of computer systems, such as storage networks, storage systems, and/or signal transmission networks. The novel technology described herein includes a number of innovative technical features and advantages over prior solutions, including, but not limited to improved data detection in a storage device and flexibility to be adapted to data detection and analysis in a variety of different fields.

BRIEF DESCRIPTION OF THE DRAWINGS

The techniques introduced herein are illustrated by way of example, and not by way of limitation, in the figures of the accompanying drawings in which like reference numerals are used to refer to similar elements.

FIG. 2A is a block diagram of an example prior art phase lock loop for a data storage device read channel.

FIG. 2B is a block diagram of an example oversampled phase lock loop for a data storage device read channel.

FIG. 3 is a graph of example oversampling rates for use with the phase lock loop of FIG. 2.

DETAILED DESCRIPTION

Novel data processing technology, such as but not limited to systems, data storage devices, read channels, and methods for detecting, decoding, and/or recovering previously encoded data in a data channel, such as a data storage read channel or data transmission receiver using a digital phase lock loop based on an oversampled digital data signal are disclosed. While this technology is described below in the context of a particular system architecture in various cases, it should be understood that the systems and methods can be applied to other architectures and organizations of hardware. It is to be understood that the embodiments discussed herein are applicable to a data storage device such as a hard disk drive (HDD) as well as a tape drive such as a tape embedded drive (TED) or an insertable tape media drive, such as those conforming to the LTO (Linear Tape Open) standards. An example TED is described in U.S. Pat. No. 10,991,390, issued Apr. 27, 2021, titled "Tape Embedded Drive," and assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

Figure 1A:
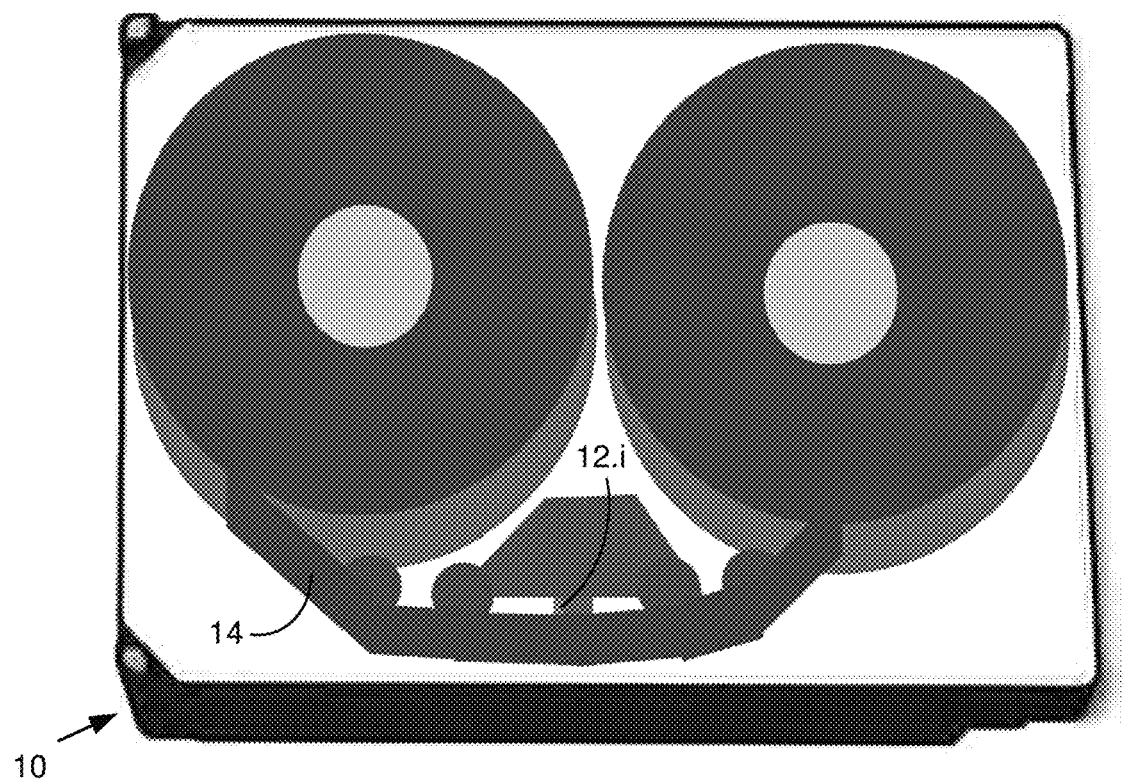
FIG. 1A shows a prior art tape data storage device comprising at least one head to configured to access a magnetic tape.
Figure 1B:
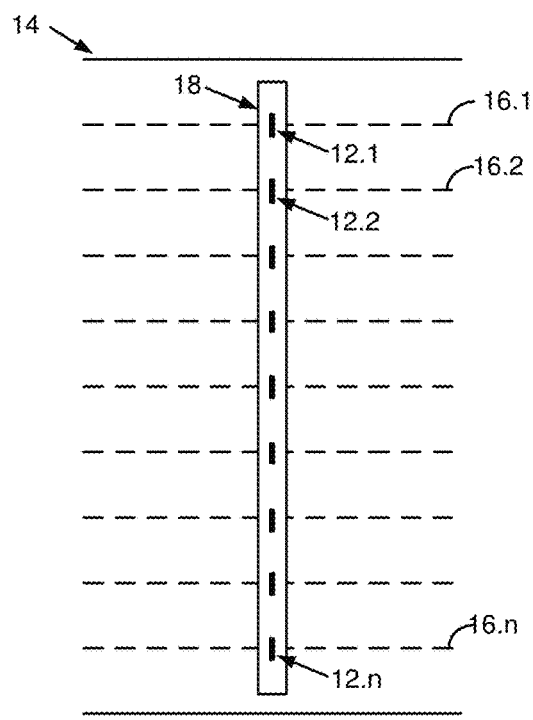
FIG. 1B shows an example prior art head bar configuration for a tape data storage device.

FIG. 1A shows a data storage device 10 comprising at least one head 12, configured to access a magnetic tape 14 having at least one data track. Data storage device 10 may include control circuitry (not shown) for controlling magnetic tape 14, head(s) 12.$i$, read/write data processing, host interface, and other functions of data storage device 10. FIG. 1B shows an example head and tape configuration for a tape data storage device, such as data storage device 10 in FIG. 1A. A first head 12.1 is configured to access a first data track 16.1 including periodic sync marks followed by data bits stored as magnetic transitions along the length of magnetic tape 14. A second head 12.2 is configured to access a second data track 16.2, which includes similar periodic sync marks and data bits in alignment with data track 16.1 along the width of magnetic tape 14 or with a predetermined offset, such as based on relative path delay per data track 16, longitudinal offset between heads 12, tilt angle of heads bar 18, etc. Heads 12.1-12.$n$ may be arranged along heads bar 18 to distribute them laterally along the width of magnetic tape 14 and position them over their corresponding data tracks 16.1-16.$n$. While nine heads 12 and tracks 16 are shown in FIG. 1B, any number of heads and tracks may be distributed along the width of magnetic tape 14, such as 8, 16, 24, or more data tracks. In some configurations, each head 12 may include at least one read element and at least one write element for reading data from and writing data to the corresponding data track 16. Data tracks 16 may include data bits corresponding to symbols of a predetermined bit length, such as 2-bit, 3-bit, 4-bit, or more symbols. The symbols may be arranged in data sectors with periodic sync marks. In some configurations, each data sector may store the data symbols of a single codeword, or in other examples, each data sector may store symbols from multiple codewords (i.e., interleaved codewords).

Data storage device 10 in FIG. 1A may comprise an embedded magnetic tape installed into a tape drive assembly with a drive form factor. For example, data storage device 10 may comprise a self-contained data storage device where heads 12, magnetic tape 14, and related control circuitry are packaged in a housing and include corresponding power, host, and other interface connectors for interfacing with a host system. In another configuration shown in FIG. 1C, data storage device 20 comprises a magnetic tape 24 in a tape cartridge 22 for removable insertion into a tape drive assembly 26. For example, data storage device 20 may comply with the Linear Tape-Open (LTO) standard for magnetic tape drives with removable tape cartridges. In some configurations, tape drive assembly 26 may include heads, control circuitry, tape guides, motors, and other elements for accessing, reading from, and writing to magnetic tape 24.

Figure 1C:
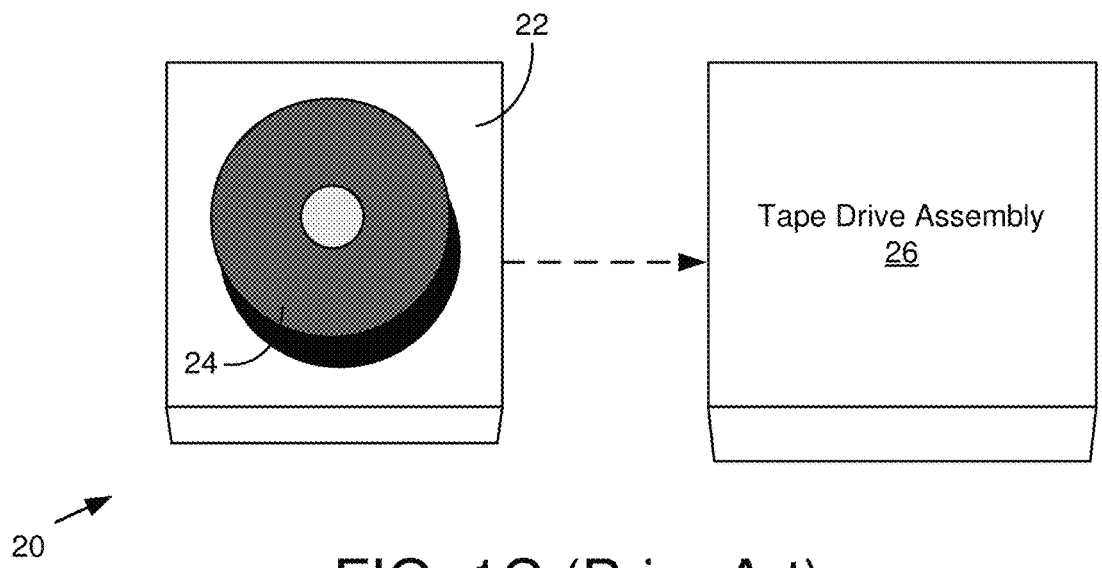
FIG. 1C shows an example prior art tape data storage device comprised of a tape drive assembly for accessing a magnetic tape housed in a cartridge assembly.

In data storage devices incorporating non-volatile storage media, such as magnetic tape 14 in FIG. 1A and magnetic tape 24 in FIG. 1C, an analog read signal from the storage media may be converted into a digital bit stream by an analog-to-digital-converter (ADC) and passed to the read channel for further processing. In some examples, bit data values may be stored to a non-volatile storage medium as data blocks or other data units using one or more encoding schemes. These bit data values may be processed from the digital bit stream in windows of multiple adjacent bits and a set of adjacent bits, such as 2, 3, 4, 5, 7, or more continuous bits from the bit stream, may be processed as a symbol for data detection and/or decoding purposes. One or more symbols may, in turn, make up one or more codewords, such as codewords selected and encoded in accordance with an error detection and/or correction scheme, such as low-density parity check (LDPC) codes. These encoded codewords may be decoded to determine decoded bit values. In some examples, the decoded bit values from these codewords may still be subject to further decoding, such as run-length limited (RLL) decoding and/or descrambling to arrive that the output data. While the description below refers to non-volatile storage medium/media (NVSM) examples, the various examples disclosed could be applied to process data read from volatile medium/media as well, as well as data signals transmitted through and/or received from a wired, wireless, or other transmission medium.

Figure 1D:
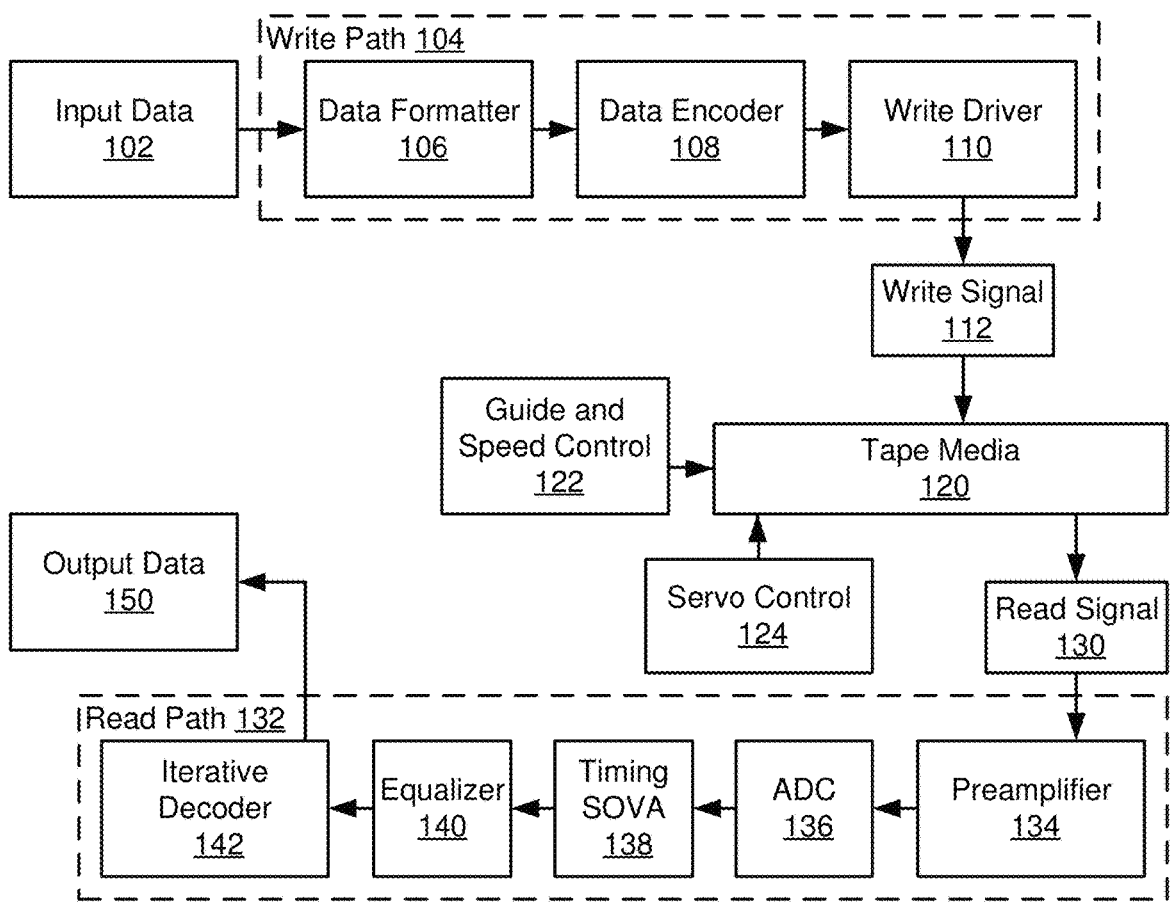
FIG. 1D is a block diagram of an example prior art tape data storage system including various data processing and tape control components.

Referring to FIG. 1D, a block diagram illustrating a data storage device 100 comprising components employed in a known read/write path for magnetic tape data storage devices is shown. For example, the components of data storage device 100 may be embodied in data storage device 10 in FIG. 1A or data storage device 20 in FIG. 1C. As illustrated, the write path 104 receives input data 102 and includes a data formatter 106, a data encoder 108, and a write driver 110. A write signal 112 may be output by write path 104 in some examples to store the resulting write bit stream to magnetic tape media 120 or some other non-volatile storage medium. In some configurations, guide and speed control 122 and servo control 124 may control one or more motors controlling the relative position of tape media 120 to one or more heads including write elements for analog write signal 112 and read elements for analog read signal 130. Read signal 130 may be read from tape media 120 for processing through a read path 132 to output the output data 150. Read path 132 includes an ADC 136, a timing soft output Viterbi algorithm (SOVA) detector 138, an equalizer 140, and an iterative decoder 142. In some configurations, both write path 104 and read path 132 may include additional analog and/or digital signal conditioning and/or data formatting and encoding/decoding features, such as data scramblers/descramblers, RLL encoders/decoders, write preconditioning circuits, variable gain amplifiers (VGA), amplitude asymmetry correction (AAC) circuits, continuous time filters (CTF), pattern-dependent noise prevention (PDNP) filters, etc. In some configurations, the components of write path 104 and read path 132 may comprise a read/write channel device or circuit.

Data formatter 106 may include one or more components configured to select and rearrange input data 102 to be written to tape media 120. For example, a data scrambler may "randomize" input data 102 (to "whiten" the input sequence of the data) to be written into a storage media. An RLL encoder may also modulate the length of stretches of repeated bits in the randomized data using a line coding technique that processes arbitrary data with bandwidth limits.

Data encoder 108 may include an iterative encoder configured to implement an error correction code and append one or more parity bits to the modulated block code for later detection whether certain errors occur during data reading process. For instance, an additional binary bit (a parity bit) may be added to a string of binary bits that are moved together to ensure that the total number of "F"s in the string is even or odd. The parity bits may thus exist in two different types, an even parity in which a parity bit value is set to make the total number of "F"s in the string of bits (including the parity bit) to be an even number, and an odd parity in which a parity bit is set to make the total number of "F"s in the string of bits (including the parity bit) to be an odd number. In some examples, data encoder 108 may implement a linear error correcting code, such as LDPC codes or other turbo codes, to generate codewords that may be written to and more reliably recovered from tape media 120. In some examples, data encoder 108 may further implement one or more single parity check codes within the codeword for recovery using soft information decoding, such as SOYA, Bahl, Cocke, Jelinek, Raviv (BCJR), or other single parity check code decoding techniques. Data encoder 108 may implement iterative encoding techniques to reuse the decoder architecture (e.g., iterative decoder 142), thereby reducing circuit space.

Write driver 110 may include a write precompensation circuit configured to alleviate the effect of nonlinearities in the writing process. Major causes of the nonlinearities during data writing include bandwidth limitations in the write path and the demagnetizing fields in the magnetic medium. These nonlinearities can cause data pattern-dependent displacements of recorded transitions relative to their nominal positions. The write precompensation circuit can compensate for these data pattern-dependent displacements by introducing data pattern-dependent compensating shifts into the signals. After compensation, the information may then be written as NRZ (non-return to zero) data as write signal 112 to the write element(s) of the heads proximate the data tracks of tape media 120.

In a magnetic tape embodiment, tape media 120 is moved relative to the read/write elements of the heads by motors and mechanical guides. For example, guide and speed control circuit 122 may include one or more control loops for adjusting and maintaining the velocity of tape media 120 as it moves past the heads. In some configurations, guide and speed control may direct one or more motors for starting, stopping, and maintaining tape velocity for different data storage and/or tape management functions. For example, during write and read operations, guide and speed control circuit 122 may be configured to maintain a target velocity to match the frequency of bit transitions passing the heads to the baud rate of the read/write channel. In some configurations, heads, a head bar, a head cylinder, or other mechanical configuration may include additional position control for aligning the heads with the data tracks for track following operations. For example, servo control circuit 124 may include at least one feedback loop for fine control of the positioning of the heads along the width of tape media using one or more servo motors.

When reading data back from tape media 120, the read head of data storage device 100 senses the transitions (changes) in the tape media 120 and converts the information back into an electronic waveform. Reading analog read signal 130 from the storage medium starts at the storage medium (e.g., magnetic tape media 120) and a head transducer read element (not shown). The head transducer is located prior to the preamplifier circuit in the data read path and the read element output is driven by the data pattern previously written on tape media 120. After converting into an electronic waveform, the read element output (e.g., read signal 130 or analog read signal) may be further processed by the components illustrated in FIG. 1D in the read path 132 for data detection, decoding, and descrambling.

Preamplifier 134 (or preamp) may include analog circuitry for applying a read voltage to the read element, receiving the resulting read signal 130 from the read element, and amplifying and conditioning read signal 130 for transmission to the read channel. For example, preamplifier 134 may receive an analog read signal from each read element, amplify the analog read signals, and pass them to corresponding analog front ends of the read channels corresponding to each data track.

In some configurations, the analog front end may include ADC 136 and one or more analog signal conditioning circuits. For example, the analog front end may include a VGA that further amplifies the analog signal from the preamplifier for a desired signal (gain) level in an automatic gain control loop. An AAC and CTF may attempt to linearize and restore the symmetry of the amplified analog signal prior to feeding it to ADC 136. It should be noted that in practice, the read back analog signals from many different commonly used heads in existing devices cannot be linearized, regardless of the kind of biasing approach that is employed. Thus, improving data detection and recovery technology in the read channel can advantageously handle the read back signals from these types of heads because it may better compensate for non-linear responses from the read heads.

ADC 136 may convert an analog read signal (e.g., read signal 130, as input and/or processed by upstream signal conditioning components) to digital samples quantized in time and amplitude. For example, ADC 136 may be configured to sample amplitude values from the analog data signal at the baud rate of the read channel (and the data written to tape media 120). ADC 136 generates a digital data signal comprised of a sequence or bit stream of sampled digital data values. In some configurations, ADC 136 and timing SOVA detector 138 may be configured for synchronous sampling, where the clock used by ADC 136 may include the output of a digital phase-lock loop, which tracks the channel (baud) rate clock frequency. The output of ADC 136 may be used as feedback to control the timing of the digital phase-locked loop as well as the automatic gain control, direct current (DC) baseline correction, and equalization. For example, timing SOVA detector 128 may attempt to detect bits in the resulting digital data signal from ADC 136 and return timing gradient information to a clock interpolation circuit that adjusts the subsequent timing of ADC samples to adjust timing frequency, phase, and/or gain in proportional-integral-derivative (PID) control loop. As described below, conventional synchronous sampling by the ADC at baud rate may be replaced, at least in part, by asynchronous sampling at an oversampled sample rate to generate an oversampled digital data signal comprised of oversampled digital data signal values at a multiple of the baud rate. These oversampled digital data signal values may be used to improve the performance of the digital phase lock loop through improved averaging and granularity of phase corrections.

Equalizer 140 may be used for compensating for channel distortion. For example, an FIR filter may perform filtering to provide additional equalization of the signal to match signal characteristic to the desired target response for bit detection. Some equalizers may also include a noise whitening filter that further equalizes the spectrum of the signal from the FIR samples to remove noise that has non-flat amplitude spectrum. For example, the noise whitening filter may enhance low-level spectral components and attenuates high-level ones. In some configurations, the equalizer may use signals from multiple read elements or head transducers and corresponding reference signals to generate an equalized digital data signal. Other filters, such as PDNP filters, may be applied to the equalized digital data signal from equalizer 140 prior to processing by iterative decoder 142.

Iterative decoder 142 may be configured to iteratively detect bit and/or symbol values in the digital data signal and decode them to return output data 150. For example, iterative decoder 142 may include a SOVA detector for iterative soft detection of bits/symbols and an inner iterative decoder for determining syndromes and matching detected symbols to valid codewords. The SOVA detector may use a Viterbi-like algorithm to decode a bit stream for bit recovery. The SOVA detector may include a variant of the classical Viterbi algorithm. It may differ from the classical Viterbi algorithm in that it uses a modified path metric which takes into account a priori probabilities of the input symbols, and produces a soft output indicating the reliability of the decision. The SOVA detector operates by constructing a trellis of state of probabilities and branch metrics. In some examples, SOVA detector may be configured to detect the probabilities of bit values based on single parity check codes. Once the bit recovery is completed, parity post-processing can be performed. In some examples, an initial set bit probabilities may be provided to the inner iterative decoder for parity-based decoding of the codeword, initiating iterative bit detection by the SOVA detector and parity determination by inner iterative decoder with the two components exchanging sets of bit probabilities as extrinsic information for reaching their maximum likelihood results and returning a decoding decision.

The inner iterative decoder may help to ensure that the states at the parity block boundary satisfy the parity constraint by conducting parity error checking to determine whether data has been lost or written over during data read/write processes. It may check the parity bits appended by data encoder 108 during the data writing process, and compare them with the bits recovered by the SOVA detector. Based on the setting of data encoder 108 in the data writing process, each string of recovered bits may be checked to see if the "F"s total to an even or odd number for the even parity or odd parity, respectively. A parity-based post processor may also be employed to correct a specified number of the most likely error events at the output of the Viterbi-like detectors by exploiting the parity information in the coming sequence. The SOVA detector and the inner iterative decoder together may be referred to as iterative decoder 142, as iterative decoding may exist between the two components. For example, the SOVA detector may pass detected sets of bit probabilities to the inner iterative decoder and the inner iterative decoder may use those bit probabilities to determine a most likely codeword match. If decode decision parameters are not met, the inner iterative decoder may feedback soft information for the set of bit probabilities to the SOVA detector as extrinsic information for further iterations of the SOVA detector and the SOVA detector may feed forward a new set of bit probabilities for each iteration to the inner iterative decoder. When decode decision parameters are met, the codeword may be decoded into a set of decoded bit values for output or further processing by, for example, an RLL decoder and a data descrambler. In some embodiments, the SOVA detector of iterative decoder 142 may also act as timing SOVA 138 for feedback in a timing loop and/or digital phase lock loop.

Referring to FIG. 2A, an example phase lock loop 200 operating on a digital data signal 202 is shown. A sequence of baud rate digital data signal values 204.1-204.n are shown for digital data signal 202, where each digital data signal value 204 ideally corresponds to a bit signal value at the baud rate of the data channel, if the timing frequency and phase of the digital samples align with the bit patterns in the analog read signal. In some configurations, digital data signal 202 may also include periodic sync marks, such as sync mark 206 for establishing initial timing synchronization between the analog read signal and the read channel. For example, each data track may be written with periodic sync marks comprised of at least one sync pattern with a pattern length configured to enable accurate detection and initial synchronization. A sync mark pattern may include a series of magnetic transitions forming a tone pattern with a known frequency. In some configuration, multiple adjacent sync marks, such as a primary and secondary sync mark, may be provided in case of corruption of the primary sync mark. In some configurations, sync marks may be coordinated across parallel data tracks on a magnetic tape medium to provide additional redundancy for determining synchronization across data tracks using adjacent data channels. For example, parallel data channels for each head and data track may share sync mark and/or synchronization information with adjacent data channels or across all data channels and data channels that have difficulty establishing timing from the sync mark in their own data track may supplement their timing information based on the synchronization data of the adjacent read channels (and corresponding parallel data tracks).

Phase lock loop 200 may be configured to determine and maintain phase lock for the read channel circuit after timing (including phase) has been initially established based on sync mark 206. For example, collected digital data signal values at baud rate may be compared with an ideal signal, obtained from partially correct detected bit patterns from a phase SOVA 220, convolved with a bit response function. In some configurations, phase SOVA 220 may determine a bit data pattern and a corresponding bit response signal from the digital sample values, and use the bit data pattern and the bit response signal to determine an ideal signal with a target phase. By comparing the measured and ideal signals, a phase mismatch (e.g., phase gradient 212) between the signals may be determined. PID control corrects phase by applying a phase correction 214 to the ADC 216 at a next phase correction point 208 to eliminate the phase mismatch. ADC 216 may operate substantially as described above for ADC 136 and use a time base 218 from the controller electronics to generate baud rate samples from analog read signal 202.

In some configurations, a sample window 210 defines a set of digital data values to be used in determining phase correction 214 at the next phase correction point 208 (which may also be the sampling point for the start of the next sample window). Sample window 210 may define a number of baud rate samples used for calculation of phase gradient 212, which represents the cumulative deviation in phase between the phase established for a current iteration of phase lock loop 200 and the actual phase of the set of digital data values that follow the last phase correction point. The number of samples in sample window 210 may determine a phase rate that is the inverse of the number of samples and may impact the sensitivity and efficiency of the PLL.

In some configurations, a phase gradient G (e.g., phase gradient 212) may be determined for a signal S across a window of samples P as:

$$G = \frac{\int \Delta S \cdot \frac{dS}{dt} P}{\int \left(\frac{dS}{dt}\right)^2 P}, \qquad (1)$$

where $\Delta S = S - S0$ is the deviation of the signal from the ideal and could be represented as $\Delta S = ds/dt G$. In some configurations, an attenuation factor may be applied to phase gradient 212 to determine phase correction 214 in order to stabilize the PLL. For example, a slower time constant may be applied to phase correction 214 to determine how frequently the phase may be corrected for ADC 216.

As shown in FIG. 2B, phase lock loop 250 may incorporate oversampling of digital data signal 202 to improve the performance of phase lock loop 250. For example, phase lock loop 250 may receive an oversampled digital data signal from an ADC to act as a partially asynchronous digital PLL. The asynchronous architecture is based on an oversampled ADC, such as a 2×, 4×, or other multiple of the nominal channel baud rate. The use of baud rate multiples of at least 2 times the baud rate provides a number of advantages for the ease of interpolation, phase adjustment, and signal quality. In some configurations, the oversampled signal is used to increase the number of samples within the same sample window 260. For example, phase gradient 262 (G) may be calculated across double the number of samples and time points for a 2× sample rate or four times the number of samples and time points for a 4× sample rate. Increasing the number of samples in sample window 260 improves accuracy of the phase gradient computation by equation (1).

Example oversampled digital signal values are shown in chart 300 of FIG. 3. An analog data signal 310 is shown. As explained in key 302, baud rate samples (e.g., baud rate digital signal value 312), 2× oversampling samples (e.g., 2× oversampled digital signal value 314), and 4× oversampling samples (e.g., 4× oversampled digital signal value 316) are shown along analog data signal 310. The different signal samples are cumulative. For example, the set of baud rate digital signal values includes only the baud rate digital signal values. The set of 2× oversampled digital signal values include the baud rate digital signal values plus the 2× oversampled digital signal values. The set of 4× oversampled digital signal values include the baud rate digital signal values, the 2× oversampled digital signal values, and the 4× oversampled digital signal values. This, an example sample window of 100 baud rate bit values would include 100 digital signal values at baud rate, 200 digital signal values at 2× oversampling, and 400 digital signal values at 4× oversampling.

Based on the oversampled signal, phase detection may be performed by phase SOVA 270 and used to calculate phase gradient 262. In some configurations, the remaining components of the read channel may use baud rate samples 204.1-204.2 for equalization, data detection and decoding, and other functions of the read channel circuit. For example, a down sample circuit 274 may reduce the oversampled signal 252.1-252.$n$ to a baud rate signal by fixed decimation, such as selecting each second sample from a 2× oversampled signal or selecting each fourth sample from a 4× oversampled signal, relying on phase correction 264 through ADC 266 to provide adequate phase correction. In some configurations, use of down sample circuit 274 may eliminate the use of interpolator 272.

In some configurations, phase lock loop 252 may use knowledge of the current phase deviation to output baud rate signals at perfect phase alignment with the ideal phase determined by phase SOVA 270 by interpolating the oversampled signal. For example, the oversampled digital data signal may be interpolated by interpolator 272 from the calculation of phase gradient 262. Interpolation may determine or approximate additional sample values between the oversampled digital signal values through linear interpolation. For example, a digital sample interpolator or signal interpolator 272 may generate additional sample values using two or more adjacent oversampled digital signal values to approximate a curve between and/or across the selected digital signal values in one or more interpolated steps. Interpolation of the oversampled digital data signal further increases the number of samples used to determine phase gradient 212 (G) and resulting phase correction 214. For example, an original (oversampled) signal $X_{os}$ may be interpolated to an interpolated set of digital signal values X based on X=interp(t, $X_{os}$, t+G). In some embodiments, interpolation of the oversampled digital data signal is calculated prior to providing the digital data signal to the SOVA detector for determining the ideal signal and resulting phase gradient 212. The interpolated digital data signal may be used to determine a baud rate digital data signal for processing by the SOVA detector. In some configurations, the multiple of the oversampling sample rate times the number of steps interpolated between adjacent oversampled digital signal values may determine a number of digital sample values per baud rate sample, the inverse of which corresponds to the step increments relative to the baud rate. For example, with a 4× sample rate and 16 interpolated signal values, baud rate samples and phase corrections may be selected in 1/64 sample steps. Using 4× rate samples, only 16 sub-sample interpolation steps may be used in order to achieve the desired interpolated signal values. Accurate interpolations may be achieved with relatively simple 2-tap or 3-tap digital finite impulse response structures.

In some configurations, the feedback loop to ADC 266 may include a different time constant T1 for phase correction 264 than the time constant T2 used for interpolator 272. For example, time constant T1 may be relatively large to provide stability in the feedback system and time constant T2 could be relatively small and generate the baud rate signal with correct phase near instantaneously. For example, time constant T2 may operate at baud rate, correcting each baud rate sample as it is passed to the other components of the read channel, while phase correction time constant T1 may operate every 10, 100, or more baud rate samples. This may allow for tuning system stability with some level of independence from accuracy. For example, for sound wave examples in tape drives, the oscillation of signal phase may have a few cycles during one sector of data, which is difficult for feedback to follow. With separate time constants, time constant T1 for phase correction 264 may keep ADC 266 sampling close to the average phase for the sector, while interpolator 272 may accurately determine current phase and provide more accurate baud rate samples at time constant T2. Different time constants T1 and T2 allow for tuning of system synchronization, with T1 contributing to synchronization of phase through feedback to ADC 266 and T2 contributing to asynchronous samples being sent to the remaining components of the read channel. Making the feedback time constant T1 very large may result in an effectively asynchronous sampling architecture, such as the asynchronous data collection shown in FIG. 4. For example, as T1 approaches the timing of synchronization marks 206 little or no corrective feedback is provided to ADC 266. Though synchronous data collection may have advantages, the option to tune the feedback parameter allows for a more robust feedback loop without losing accuracy and provides additional design options for configuring read channel circuits in data storage devices.

Figure 4:
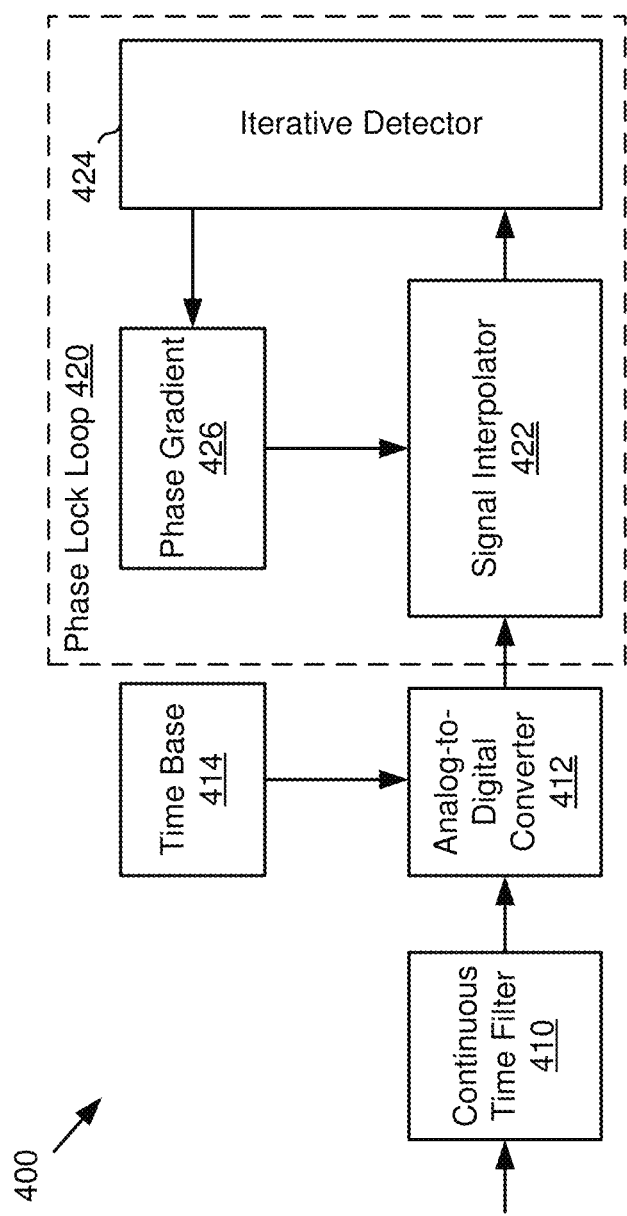
FIG. 4 is a portion of a read channel circuit including an oversampled phase lock loop with signal interpolation.

FIG. 4 shows an example asynchronous sampling architecture 400 with an oversampled ADC and digital PLL. In some configurations, architecture 400 may be implemented in a channel circuit, such as read path 132 in FIG. 1D. For example, an analog data signal, such as the read signal from preamplifier 134, may be received by continuous time filter 410 and processed using the components of asynchronous sampling architecture 400 to establish phase correction for signal equalization and data bit detection and decoding in the read channel.

Continuous time filter (CTF) 410 may include analog logic for filtering the analog data signal from the preamp to adjust the frequency of the incoming read data signal. In some configurations, due to the higher (oversampling) sample rate of ADC 412 and the asynchronous digital phase lock loop 420, the design of continuous time filter 410 may be simplified. CTF 410 may provide mid-band peaking to help attenuate high-frequency noise and minimize any aliasing that may occur when the analog signal is converted to a sampled representation. CTF 410 may comprise a multiple pole low pass filter (e.g., a four pole Butterworth filter) with a zero available for mid-band peaking. Signal peaking can be used to emphasize frequency components, which are useful in shaping the signal to meet the digital target signal characteristic. Besides anti-aliasing, the CTF 410 may also partially equalize the data. In some configurations, gain control and other analog signal conditioning operations may be executed prior to the analog data signal reaching ADC 412.

ADC 412 may include an analog circuit that generates and outputs digital sample values by sampling an analog input at a particular sample rate. For example, ADC 412 may convert an analog read signal of time-varying voltages representing the bits stored in a non-volatile storage medium to a series of discrete sample values corresponding to the magnitude of the voltage at the sample time. The sample rate of ADC 412 determines the number of samples determined per unit time. Because of the digital output of ADC 412, the digital functions are governed by a digital timing signal or time base 414 provided by the digital electronics and power source to which ADC 412 is connected. In some configurations, ADC 412 may be configured for oversampling relative to the baud rate of the read/write channel and data stored to the non-volatile storage medium. For example, a data storage device controller may support a time base that is substantially higher than the baud rate of the data channels and this higher time base 414 may be used to drive ADC 412 to oversample the analog data symbol at an oversampling sample rate that is a multiple of the baud rate by 2× or more. In some configurations, time base 414 may support a sampling rate of 4× or more for ADC 412, resulting in an oversampled digital signal comprised of four oversampled digital sample values for every single baud rate digital sample value. ADC 412 may output the oversampled digital signal comprised of oversampled digital sample values to a digital sample interpolator, such as signal interpolator 422 in digital phase lock loop 420. In some configurations, the oversampled digital signal may pass through an anti-aliasing filter before reaching signal interpolator 422. For example, the anti-aliasing filter may be a low pass filter with a cutoff frequency set to the Nyquist frequency value for the oversampling sample rate. In some configurations, ADC 412 may be a 5-bit ADC configured for 4× oversampling of the analog data signal to generate four oversampled digital sample values per bit time of phase lock loop 420. In some configurations, ADC 412 may output a baud rate digital signal for use by other components, in addition to the oversampled digital signal used by phase lock loop 420.

Phase lock loop 420 may be comprised of signal interpolator 422, iterative detector 424, and a phase gradient 426 that feeds back to signal interpolator 422 to adjust the phase during the next iteration of signal interpolation for phase correction. For example, digital signal interpolator 422 may receive the oversampled digital signal from ADC 412, interpolate a series of interpolated digital signal values across two or more digital samples in the oversampled digital signal, and determine the phase correction for phase lock loop 420.

Signal interpolator 422 may include one or more circuits for receiving an oversampled digital signal from ADC 412, selecting a set of oversampled digital signal values, interpolating a series of interpolated digital signal values between and across multiple oversampled digital signal values, and adjusting baud rate sample values based on a phase correction from the other components of phase lock loop 420. Signal interpolator 422 may output the baud rate digital signal to other components of the read/write channel, such as iterative detector 424 and/or an equalization circuit. In some configurations, signal interpolator 422 may be comprised of one or more digital finite impulse response (DFIR) structures configured for interpolating the incoming oversampled data stream. For example, signal interpolator 422 may be configured for multipoint interpolation, such as two-point, three-point, four-point, or more interpolation, and use a DFIR with a number of taps equal to the number of interpolation points or steps. In some configurations, the tap weights used in the DFIR may be derived using an interpolating polynomial that passes through N-sample points. For example, 16 sets of tap weights may be used to interpolate in 1/16 steps between adjacent 4× rate samples, resulting in 64 steps between baud rate samples. The interpolated digital signal values between adjacent oversampled digital sample values (whether based on two-point, three-point or more interpolation) may be assembled in a continuous stream for selecting sets of digital data values for calculating the phase gradient. Signal interpolator 422 may operate on a set of oversampled sample values of at least the oversampling rate and determine a curve between adjacent oversampled values. For example, with a 4× sample rate and based on 16 interpolated values, a 64-step curve of interpolated digital signal values may be used for determining each baud rate digital signal value.

Signal interpolator 422 may select the corresponding phase correction values from anywhere among the interpolated digital signal values in the 64-step curve, enabling the baud rate digital signal to be adjusted for precise phase differences. Phase-adjusted baud rate sample values may not align with any single oversampled sample value. For example, once timing is established, signal interpolator 422 may adjust the phase along the interpolated digital signal at 64 step increments corresponding to each baud rate sample, regardless of where those baud rate sample points fall on the curve. In some configurations, a lower oversampling rate (e.g., 2×) may use a higher number of interpolation points and/or steps to achieve a desired level of granularity in the interpolated digital signal values. Signal interpolator 422 may pass the phase correction for correcting baud rate sample values in a baud rate digital signal for equalization and detection by iterative detector 424. An equalization circuit and iterative detector may receive the baud rate digital signal and use it for equalization and data detection. Iterative detector 424 may generate phase data indicative of misalignment of the current phase with an ideal phase.

The soft information from incomplete bit detection generated by iterative detector 424 may be used to determine one or more phase gradients 426. For example, iterative detector may provide soft information configured to determine a delta value indicating a phase error or misalignment between the detected data bits (as the ideal signal) and the baud rate digital data signal. The delta value may be used as or determine phase gradient 426 for adjusting the sample timing of signal interpolation 422. For example, on a next iteration through phase lock loop 420, signal interpolator 422 may use phase gradient 426 to adjust the phase of the baud rate samples relative to prior samples and/or each other in an attempt to better align the phase for the next iteration with the ideal or target phase. Phase lock loop 420 may iterate through signal interpolator 422, iterative detector 424, and phase gradient 426 to continuously monitor and adjust the phase of the read channel in the channel circuit.

Figure 5:
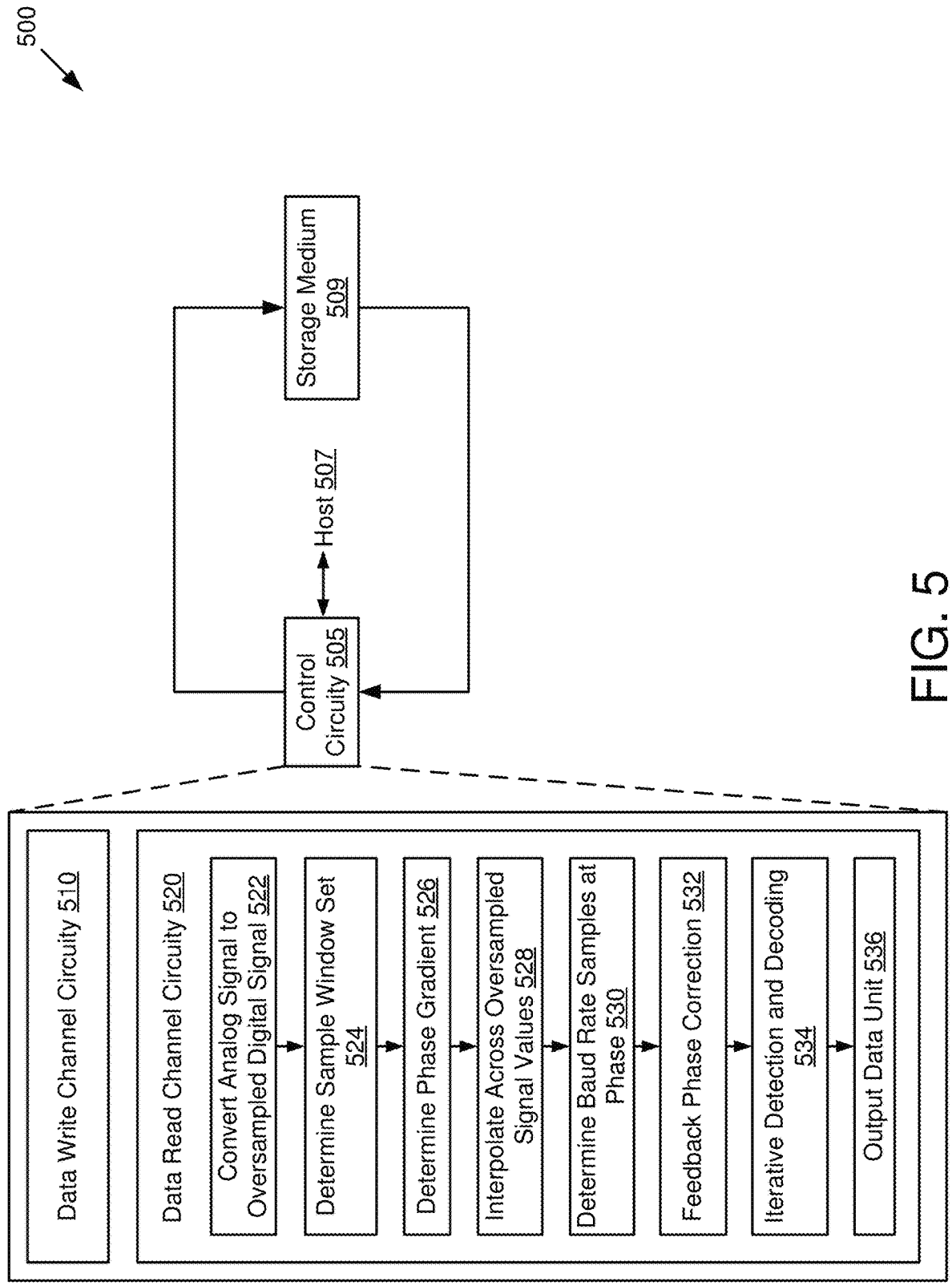
FIG. 5 is an example data storage device incorporating a phase lock loop with oversampling in data read channel circuitry.

FIG. 5 is a block diagram illustrating an example storage system 500 having an oversampled PLL in a read channel circuit. As illustrated, the storage system 500 includes control circuitry 505, a host computing system 507 (may be simply referred as "host"), and a storage medium 509. Storage medium 509 may comprise any suitable storage medium including, but not limited to the storage medium used in a hard disk drive (HDD), a solid-state drive (SSD), a flash drive, an optical drive, a tape drive, volatile or non-volatile memory, etc. As such the storage system 500 can take on the form of these various storage drives or memory devices.

Host 507 is a computer system or other external system or device to which storage medium 509 is coupled and/or with which storage medium 509 is integrated. Storage medium 509 is accessible for data storage and I/O (input/output) operations. For instance, host 507 may issue commands for data manipulation in storage medium 509. Control circuitry 505 mediates the communication between host 507 and storage medium 509 and provides an interface between storage medium 509 and a bus connecting it to the rest of the system. For example, control circuitry 505 may be a drive assembly or memory controller of a data storage device. As illustrated in the figure, control circuitry 505 may include data write channel circuitry 510 for data writing execution and data read channel circuitry 520 for data reading execution. For example, data write channel circuitry 510 may incorporate elements similar to write path 104 in FIG. 1D and data read channel circuitry 520 may incorporate elements similar to read path 132 in FIG. 1D. In the disclosed examples, control circuitry 505 may employ an oversampled PLL in line between an ADC and an iterative decoder to improve error rate performance.

When reading data from storage medium 509, control circuitry 505 may receive a command signal from host 507, which instructs control circuitry 505 to access a certain portion of storage medium 509 (e.g., the locations of blocks on a magnetic tape, on a magnetic disk, in memory, etc. corresponding to a data unit) to be accessed. As a further example, in an embodiment involving a magnetic tape storage device, in response to the command signal, guide and speed control circuitry within control circuitry 605 may produce control signals that position a desired data track adjacent a corresponding head in the storage drive, which develops a read signal indicative of flux reversals in the track over which the data head is positioned.

An input signal (e.g., the read signal) may, in some cases, be provided to preconditioning logic in the data read channel circuitry 520, which may include a preamplifier, an analog to digital converter (ADC) and/or filtering circuitry, as is described elsewhere herein, such as with reference to FIGS. 1D, 2, and 4. As shown in block 522, the ADC may convert analog signals into digital samples forming a bit or symbol sequence in an oversampled digital data signal, where the sample rate is a multiple of the channel baud rate. A sample window set of oversampled digital signal values may be determined at block 524. At block 526, a phase gradient may be determined based on initial data detection by a SOVA detector, such as a phase SOVA detector. The set of oversampled digital signal values may be interpolated at block 528 to determine additional digital signal values between the oversampled digital signal values. Baud rate samples may be determined at block 530 based on the current phase determined by the phase gradient and using the interpolated digital signal values to select baud rate samples with the desired phase. A phase correction may be determined and fed back at block 532 to apply the phase correction to the next set of baud rate samples. The phase-corrected baud rate digital data signal may be sent to an iterative decoder for detection and decoding at block 534. At block 536, the decoded data unit may then be output to host computing system 507 in response to a read command signal received from host 507.

Figure 6:
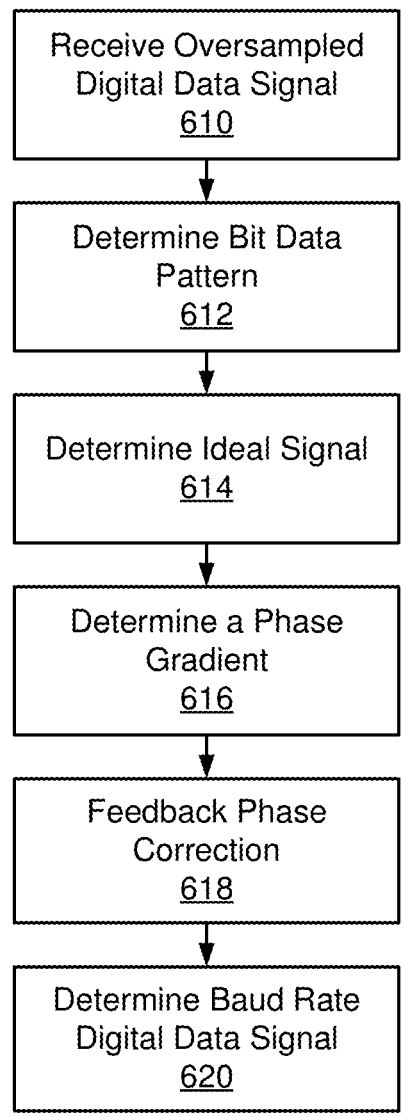
FIG. 6 is an example method of correcting phase using an oversampled phase lock loop.

As shown in FIG. 6, a read channel circuit incorporating phase lock loop 200 and/or architecture 400 and/or data storage device 500 may be operated according to an example method of correcting phase using an oversampled phase lock loop, i.e., according to the method 600 illustrated by blocks 610-616.

At block 610, an oversampled digital data signal may be received. For example, a phase lock loop may receive an oversampled digital data signal from an ADC configured with a sample rate that is a multiple of the baud rate of the channel.

At block 612, a bit data pattern may be determined from the oversampled digital signal values. For example, a phase SOVA may perform a partial detection to determine the bit data pattern for a set of oversampled digital data signal values across a sample window.

At block 614, an ideal signal may be determined. For example, the phase SOVA may generate a bit response signal for the detected bit data pattern across the set of oversampled digital signal values and determine an ideal signal corresponding to an equivalent set of digital signal values with correct phase.

At block 616, a phase gradient may be determined. For example, the phase lock loop may compare each oversampled digital signal value corresponding to the bit data pattern to the corresponding digital signal value from the ideal signal to calculate the sample-by-sample differences between the current phase and an ideal phase, which may be used to calculate a phase gradient.

At block 618, a phase correction may be fed back through the phase lock loop. For example, a gradient engine may determine a phase correction based on the phase gradient from block 616 and feed the phase gradient back to the signal interpolator and/or the ADC for correction of the phase for a next set of digital sample values.

At block 620, a baud rate digital data signal may be determined and forwarded to the other components of the read channel. For example, a signal interpolator and/or a down sample circuit may determine samples at baud rate based on the oversampled digital signal values, with or without correcting the phase of the selected baud rate samples.

Figure 7:
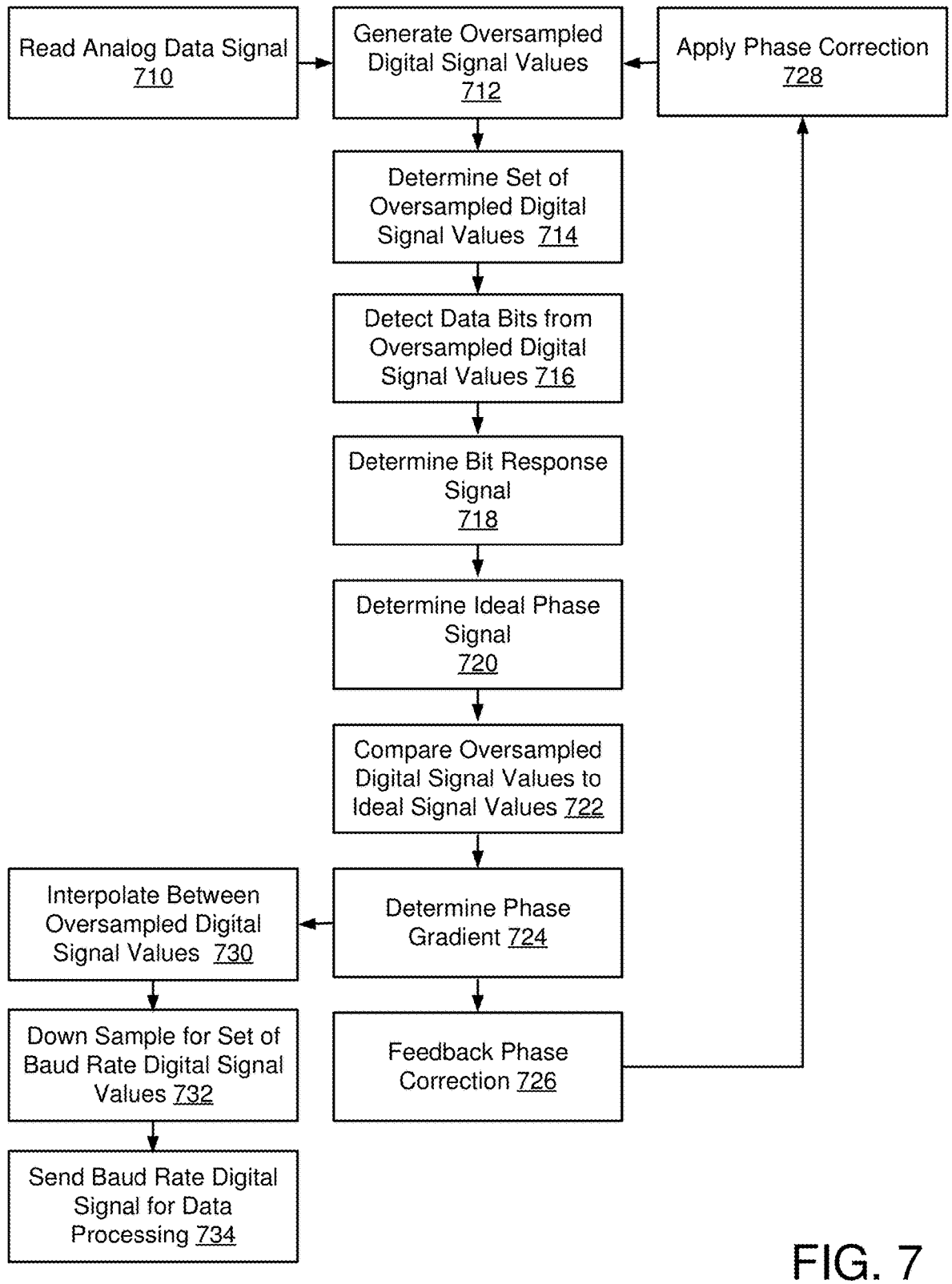
FIG. 7 is another example method of correcting phase using an oversampled phase lock loop.

As shown in FIG. 7, a read channel circuit incorporating phase lock loop 200 and/or architecture 400 and/or data storage device 500 may be operated according to another example method of correcting phase using an oversampled phase lock loop, i.e., according to the method 700 illustrated by blocks 710-728.

At block 710, an analog data signal may be read from a storage medium. For example, a head positioned proximate a data tracks of a magnetic tape medium may generate an analog read signal corresponding to the data bits previously stored to the magnetic tape medium.

At block 712, oversampled digital signal values may be generated. For example, an ADC may generate digital signal values from the analog read signal using a sample rate that is a multiple of the baud rate of the read channel.

At block 714, a set of oversampled digital signal values may be determined. For example, the phase lock loop may operate on a moving sample window for generating each phase correction and the set of samples may include a set of oversampled digital signal values that are a multiple of the baud rate data bit representations in the original analog data signal.

At block 716, data bits may be detected from the oversampled digital signal values. For example, a SOVA detector may process a symbol comprised of one or more bits to determine soft information indicative of bit values in the symbol.

At block 718, a bit response signal may be determined. For example, based on the detected data bit pattern, the bit sample values may be used to determine the bit response signal.

At block 720, an ideal phase signal may be determined. For example, based on the detected bit pattern and the bit response signal, the phase lock loop may determine an ideal signal representing the detected bit pattern at the desired or ideal phase.

At block 722, oversampled digital signal values corresponding to the bit data pattern may be compared to ideal signal values from the ideal signal. For example, the phase lock loop may determine a difference between the phase of the oversampled digital signal values and the ideal signal values to quantify the phase deviation between the signals at each sample point.

At block 724, a phase gradient may be determined. For example, the phase lock loop may calculate a phase gradient from the difference values for phase deviation from block 722.

At block 726, a phase correction may be fed back in the phase lock loop. For example, the phase lock loop may determine a phase correction value from the phase gradient and provide it back to earlier components in the loop, such as the signal interpolator and/or the ADC.

At block 728, the phase correction may be applied to a next iteration of the phase lock loop. For example, the phase correction value from block 726 may be applied by the ADC to generation of the next set of oversampled digital signal values.

At block 730, additional digital signal values may be interpolated between the oversampled digital signal values. For example, a signal interpolator in the phase lock loop may approximate the curves between the oversampled digital signal values to determine additional sample points at sample steps between adjacent oversampled digital signal values.

At block 732, the set of oversampled digital signal values may be down sampled to determine a set of baud rate digital signal values. For example, a subset of the oversampled digital signal values may include baud rate samples selected from the ADC samples, such as by a down sample circuit, or from the interpolated signal values where the interpolator includes a down sampling function to select phase-corrected samples based on the current phase value for that bit or symbol.

At block 734, the baud rate digital signal may be sent for data processing. For example, the phase lock loop may send the baud rate digital signal based on the samples determined at block 732 to other components of the read channel, such as an equalizer and/or iterative decoder for processing the digital data to decode and return the host data from the non-volatile storage medium.

Figure 8:
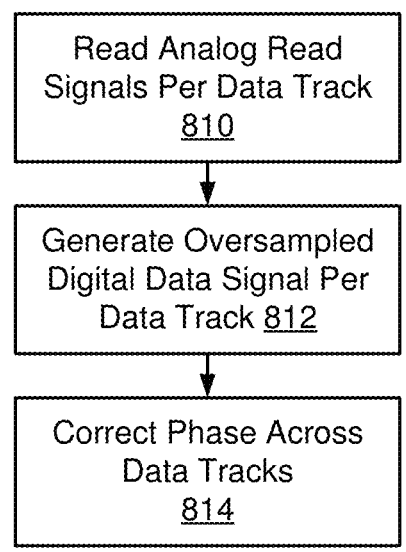
FIG. 8 is an example method of using an oversampled phase lock loop to correct phase across multiple data tracks in a magnetic tape data storage device.

As shown in FIG. 8, a read channel circuit incorporating phase lock loop 200 and/or architecture 400 and/or data storage device 500 may be operated according to another example method of using an oversampled phase lock loop to correct phase across multiple data tracks in a magnetic tape data storage device, i.e., according to the method 800 illustrated by blocks 810-814.

At block 810, analog read signals may be read per data track from multiple parallel data tracks. For example, multiple heads may be arranged across the width of a magnetic tape medium for reading parallel data tracks as the magnetic tape medium moves past the heads.

At block 812, oversampled digital data signals may be generated per data track. For example, each data track may correspond to parallel read channels with corresponding ADCs, phase lock loops, and iterative decoders, and each ADC may be configured with a sample rate that is a multiple of the channel baud rate.

At block 814, phase may be corrected across data tracks. For example, each data channel may include an oversampled phase lock loop and phase correction values from each phase lock loop or some subset of adjacent track phase lock loops may be averaged for determining the phase correction value to be fed back in each phase lock loop.

Technology for improved read channel data detection using a phase lock loop based on an oversampled digital data signal is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A channel circuit, comprising:
a phase lock loop configured to:
receive a digital data signal representing a series of data bits at a baud rate from an analog read signal, wherein the digital data signal includes oversampled digital signal values at a sample rate that is a multiple of the baud rate;
determine a bit data pattern from the oversampled digital signal values of the digital data signal;
determine, based on the bit data pattern and a bit response signal, an ideal signal;
determine, based on a comparison of the bit data pattern and the ideal signal, a phase gradient; and
feedback, based on the phase gradient, a phase correction for a next iteration of the phase lock loop.

2. The channel circuit of claim 1, further comprising:
an analog-to-digital converter configured to:
generate, based on the sample rate, the oversampled digital signal values from the analog read signal;
receive, from the phase lock loop, the phase correction; and
correct a phase of a next set of oversampled digital signal values.

3. The channel circuit of claim 1, further comprising:
a down sample circuit configured to:
receive the oversampled digital signal values;
down sample the oversampled digital signal values to a baud rate digital signal; and
send the baud rate digital signal for data processing.

4. The channel circuit of claim 1, further comprising:
a signal interpolator configured to:
interpolate a set of oversampled digital signal values to approximate digital signal values between oversampled digital signal values in the set of oversampled digital signal values; and
determine a corresponding set of baud rate digital signal values based on the phase gradient corresponding to the ideal signal.

5. The channel circuit of claim 4, wherein:
the phase lock loop is further configured to use a first time constant for feedback of the phase correction for the next iteration of the phase lock loop;
the signal interpolator is further configured to use a second time constant for determining the corresponding set of baud rate digital signal values; and
the first time constant is larger than the second time constant.

6. The channel circuit of claim 1, wherein the phase lock loop comprises an iterative detector configured to:
determine the bit data pattern from the oversampled digital signal values;

determine the bit response signal from the oversampled digital signal values; and determine, based on the bit data pattern and a bit response signal, the ideal signal.

7. The channel circuit of claim 6, wherein the phase lock loop further comprises a gradient engine configured to:

compare the bit data pattern and the ideal signal; and determine, based on the comparison of the bit data pattern and the ideal signal, the phase gradient.

8. The channel circuit of claim 7, wherein the sample rate is at least double the baud rate of the channel circuit.

9. A data storage device comprising the channel circuit of claim 1 and further comprising:

a non-volatile storage medium configured to store data; and at least one read element configured to generate the analog read signal from the non-volatile storage medium.

10. The data storage device of claim 9, wherein:

the non-volatile storage medium comprises magnetic tape comprised of a plurality of data tracks;

the at least one read element includes a plurality of read elements corresponding to the plurality of data tracks; and the phase lock loop is further configured to correct phase across the plurality of data tracks based on oversampled digital signal values from a plurality of analog read signals corresponding to the plurality of data tracks.

11. A method comprising:

receiving, in a phase lock loop, a digital data signal representing a series of data bits at a baud rate from an analog read signal, wherein the digital data signal includes oversampled digital signal values at a sample rate that is a multiple of the baud rate;

determining a bit data pattern from the oversampled digital signal values of the digital data signal;

determining, based on the bit data pattern and a bit response signal, an ideal signal;

determining, based on a comparison of the bit data pattern and the ideal signal, a phase gradient; and feeding back, based on the phase gradient, a phase correction for a next iteration of the phase lock loop.

12. The method of claim 11, further comprising:

generating, by an analog-to-digital converter and based on the sample rate, the oversampled digital signal values from the analog read signal;

receiving, by the analog-to-digital converter and from the phase lock loop, the phase correction; and correcting a phase of a next set of oversampled digital signal values.

13. The method of claim 11, further comprising:

down sampling the oversampled digital signal values to a baud rate digital signal; and sending the baud rate digital signal for data processing.

14. The method of claim 11, further comprising:

interpolating a set of oversampled digital signal values to approximate digital signal values between oversampled digital signal values in the set of oversampled digital signal values; and determining a corresponding set of baud rate digital signal values based on the phase gradient corresponding to the ideal signal.

15. The method of claim 14, wherein:

the phase lock loop uses a first time constant for feedback of the phase correction for the next iteration of the phase lock loop;

a signal interpolator uses a second time constant for determining the corresponding set of baud rate digital signal values; and the first time constant is larger than the second time constant.

16. The method of claim 11, further comprising:

determining the bit response signal from the oversampled digital signal values; and comparing the bit data pattern and the ideal signal.

17. The method of claim 11, wherein the sample rate is at least double the baud rate.

18. The method of claim 11, further comprising:

reading a plurality of analog read signals from a plurality of data tracks on a magnetic tape;

generating a plurality of digital data signals comprising a plurality of oversampled digital signal values from the plurality of analog read signals; and correcting phase across the plurality of data tracks based on the plurality of oversampled digital signal values.

19. A system comprising:

means for receiving a digital data signal representing a series of data bits at a baud rate from an analog read signal, wherein the digital data signal includes oversampled digital signal values at a sample rate that is a multiple of the baud rate;

means for determining a bit data pattern from the oversampled digital signal values of the digital data signal;

means for determining, based on the bit data pattern and a bit response signal, an ideal signal;

means for determining, based on a comparison of the bit data pattern and the ideal signal, a phase gradient; and means for feeding back, based on the phase gradient, a phase correction for a next iteration of a phase lock loop.

* * * * *